(12) United States Patent
Matsumoto et al.

(10) Patent No.: US 12,253,561 B2
(45) Date of Patent: Mar. 18, 2025

(54) SEMICONDUCTOR DEVICE, DEBUG SYSTEM, AND DEBUG METHOD

(71) Applicant: RENESAS ELECTRONICS CORPORATION, Tokyo (JP)

(72) Inventors: Masahide Matsumoto, Tokyo (JP); Kazunori Ochiai, Tokyo (JP); Tomoyoshi Ujii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 43 days.

(21) Appl. No.: 18/483,714

(22) Filed: Oct. 10, 2023

(65) Prior Publication Data

US 2024/0168089 A1  May 23, 2024

(30) Foreign Application Priority Data

Nov. 21, 2022 (JP) ................. 2022-185530

(51) Int. Cl.
*G01R 31/317* (2006.01)
(52) U.S. Cl.
CPC .. *G01R 31/31705* (2013.01); *G01R 31/31718* (2013.01); *G01R 31/31727* (2013.01)
(58) Field of Classification Search
CPC ........ G01R 31/31718; G01R 31/31705; G01R 31/31727; G06F 11/34; G06F 11/36; G06F 11/3656; G06F 11/3698
See application file for complete search history.

(56) References Cited

U.S. PATENT DOCUMENTS

| | | | | |
|---|---|---|---|---|
| 6,516,428 B2* | 2/2003 | Wenzel | ............... | G06F 11/3648 714/E11.2 |
| 7,861,070 B2* | 12/2010 | Huang | ................ | G06F 11/3636 717/128 |
| 2018/0285233 A1* | 10/2018 | Norrie | ................. | G06F 11/3466 |
| 2022/0374326 A1* | 11/2022 | Fleckenstein | ......... | G06F 11/348 |

FOREIGN PATENT DOCUMENTS

JP 2013-109621 A 6/2013
WO WO-2011039570 A1 * 4/2011 .......... G06F 11/3648

* cited by examiner

*Primary Examiner* — Shelly A Chase
(74) *Attorney, Agent, or Firm* — Rimon P.C.

(57) ABSTRACT

According to one embodiment, a semiconductor device includes a first chip and a second chip arranged on a substrate, the first chip outputs first time stamp data and first trace data in which a time stamp value is associated with a first execution result obtained by executing software, the second chip outputs second trace data in which a difference value with a marker is associated with a second execution result obtained by executing the software, the second execution result obtained by the second chip executing the software is associated with a third time stamp value calculated based on a second time stamp value and the difference value in a debugger.

20 Claims, 11 Drawing Sheets

SEMICONDUCTOR DEVICE, DEBUG SYSTEM, AND DEBUG METHOD

CROSS-REFERENCE TO RELATED APPLICATIONS

The present application claims priority from Japanese Patent Application No. 2022-185530 filed on Nov. 21, 2022, the content of which is hereby incorporated by reference to this application.

BACKGROUND

The present disclosure relates to a semiconductor device, a debug system, and a debug method.

There is a disclosed technique listed below.

[Patent Document 1] Japanese Unexamined Patent Application Publication No. 2013-109621

Patent Document 1 discloses that a semiconductor device having a plurality of Central Processing Unit (CPU) cores outputs trace data of the plurality of CPU cores. The semiconductor device of Patent Document 1 shares time stamps, for example, when the two CPU cores generate the trace data at the same time. This synchronizes the time stamps. Further, the semiconductor device of Patent Document 1 reduces the trace data by making the time stamps common and collecting them into one.

SUMMARY

In the semiconductor device of a chiplet configuration that is configured by a plurality of chips having the CPU cores, it is desired that each piece of trace data outputted from each chip is synchronized.

Other problems and novel features will be apparent from the description of the present specification and the accompanying drawings.

According to one embodiment, a semiconductor device includes a first chip and a second chip arranged on a substrate, the first chip has: a time stamp counter holding a series of first time stamp values, which is obtained by sequentially counting a first standard time and corresponds to the first standard time; a marker generation unit generating a marker indicating a predetermined time of the first standard time and outputting the marker to the second chip; a first processing unit executing software to be debugged; and a first control unit outputting time stamp data including the first time stamp value and first trace data in which the first time stamp value is associated with an execution result obtained by the first processing unit executing the software, the second chip has: a difference counter holding a series of difference values between a second standard time and the marker, which is obtained by sequentially counting the second standard time; a second processing unit executing the software; and a second control unit outputting, second trace data in which the difference values are associated with, in the debugger, an execution result obtained by the second processing unit executing the software, and the execution result obtained by the second processing unit executing the software is associated with a series of second time stamp values corresponding to the first standard time.

According to one embodiment, a debug system includes a semiconductor device and a debugger, the semiconductor device includes a first chip and a second chip arranged on a substrate, the first chip has: a time stamp counter holding a series of first time stamp values, which is obtained by sequentially counting a first standard time and corresponds to the first standard time; a marker generation unit generating a marker indicating a predetermined time of the first standard time and outputting the marker to the second chip; a first processing unit executing the software; and a first control unit outputting time stamp data including the first time stamp value and first trace data in which the first time stamp value is associated with an execution result obtained by the first processing unit executing the software, the second chip has: a difference counter holding a series of difference values between a second standard time and the marker, which is obtained by sequentially counting the second standard time; a second processing unit executing the software; and a second control unit outputting second trace data in which the difference values are associated with the execution result obtained by the second processing unit executing the software, and the debugger calculates a series of second time stamp values which corresponds to the first standard time, and associates the calculated second time stamp value with the execution result obtained by the second processing unit executing the software.

According to one embodiment, a debug method includes: preparing a debug system, the debug system having a semiconductor device and a debugger, the semiconductor device including a first chip and a second chip arranged on a substrate; causing the first chip to: hold a series of first time stamp values, which is obtained by sequentially counting the first standard time and corresponds to the first standard time; generate a marker indicating a predetermined time of the first standard time; output the marker to the second chip; execute the software; and output time stamp data including the first time stamp value, and first trace data in which the first time stamp value is associated with an execution result obtained by executing the software; causing the second chip to: hold a series of difference values between a second standard time and the marker, which is obtained by sequentially counting the second standard time; execute the software; and output second trace data in which the difference values are associated with the execution result obtained by executing the software; causing the debugger to: calculate a series of second time stamp values, which corresponds to the first standard time; and associate the calculated second time stamp value with the execution result obtained by the second chip executing the software.

According to one embodiment mentioned above, the semiconductor device, the debug system, and the debug method which are capable of synchronizing the trace data outputted from the plurality of chips can be provided.

DETAILED DESCRIPTION

Figure 1:
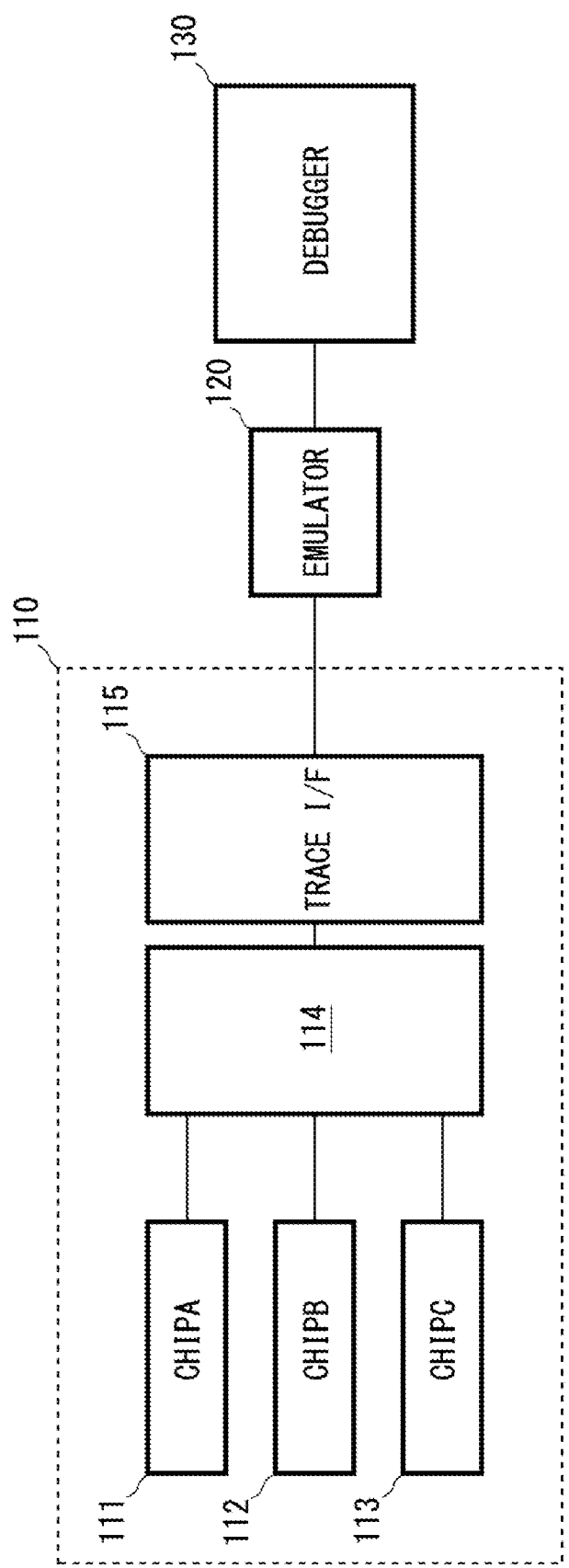
FIG. 1 is a configuration diagram illustrating a debug system according to a first comparative example.

For clarity of explanation, the following descriptions and drawings will be omitted and simplified appropriately. Moreover, in each drawing, the same elements are denoted by the same reference numerals, and a redundant description thereof will be omitted as necessary.

First, a debug system according to a comparative example and problems found by the inventors regarding the debug system will be described. Thereafter, a semiconductor device, a debug system, and a debug method according to embodiments will be described. Incidentally, the debug system and the problems according to the comparative example are also included in the scope of the technical ideas of the embodiments.

Comparative Example

FIG. 1 is a configuration diagram illustrating a debug system according to a first comparative example. As shown in FIG. 1, a debug system 101 of the comparative example includes a semiconductor device 110, an emulator 120, and a debugger. The semiconductor device 110 includes, for example, a chiplet configuration device configured by chiplets. The chiplet configuration device includes a chip A111, a chip B112, and a chip C113. Accordingly, the semiconductor device 110 includes a plurality of chips.

Software that operates on the semiconductor device 110 of the chiplet configuration device is processed in cooperation among the chip A111, the chip B112, and the chip C113. In the semiconductor device 110 of the comparative example, a time stamp counter in each chip measures time individually. Then, each time stamp counter in each chip adds a time stamp value to trace data, and outputs it. An arbitration circuit 114 merges each piece of trace data of each chip, and outputs the trace data from a trace interface 115. A general method of merging the trace data is to use a First In First Out (FIFO) memory. An ID for differentiating each chip is added to the trace data so that it can be differentiated.

The trace data is outputted to the debugger 130 via the emulator 120. The debugger 130 displays the trace data. Such a comparative example has the following problems.

The software that operates on the semiconductor device 110 of the chiplet configuration device is processed in cooperation among the chip A111, the chip B112, and the chip C113. Therefore, in debugging the software, if the trace data is acquired for each chip, a cooperative operation with other chips cannot be grasped. Accordingly, development efficiency of the software cannot be improved.

For example, in the semiconductor device 110 having a chiplet configuration in which the plurality of chips including processors such as CPU cores are mounted, the time stamp counter of each chip operates asynchronously. Accordingly, the time stamp counters of the respective chips are different in a time unit and a time as a reference. Consequently, even if the respective pieces of trace data of the respective chips are checked side by side, standards of the time stamp values are different. Accordingly, a context of a software execution result of each chip becomes unknown. Therefore, in debugging the software, it is necessary to synchronize the respective time stamp values of the respective chips.

In addition, the semiconductor device 110 of the chiplet configuration device requires a large number of interfaces for inputting/outputting various pieces of data. Therefore, the semiconductor device 110 has many external terminals that are used for purposes other than outputting the trace data. Accordingly, that the number of external terminals is large becomes a bottleneck, and it is difficult to secure the trace interfaces 115 every all the chips. Accordingly, the trace interfaces 115 for outputting the trace data may be integrated into one. In that case, each trace data of each chip is outputted from one trace interface 115 integrated in the semiconductor device 110.

If a trace data amount to be outputted increases with respect to an allowable amount of one trace interface 115, a lack of the trace data may occur. This makes it impossible to obtain the necessary trace data. Therefore, it is necessary to reduce the trace data amount and reduce a frequency of the lack.

First Embodiment

Figure 2:
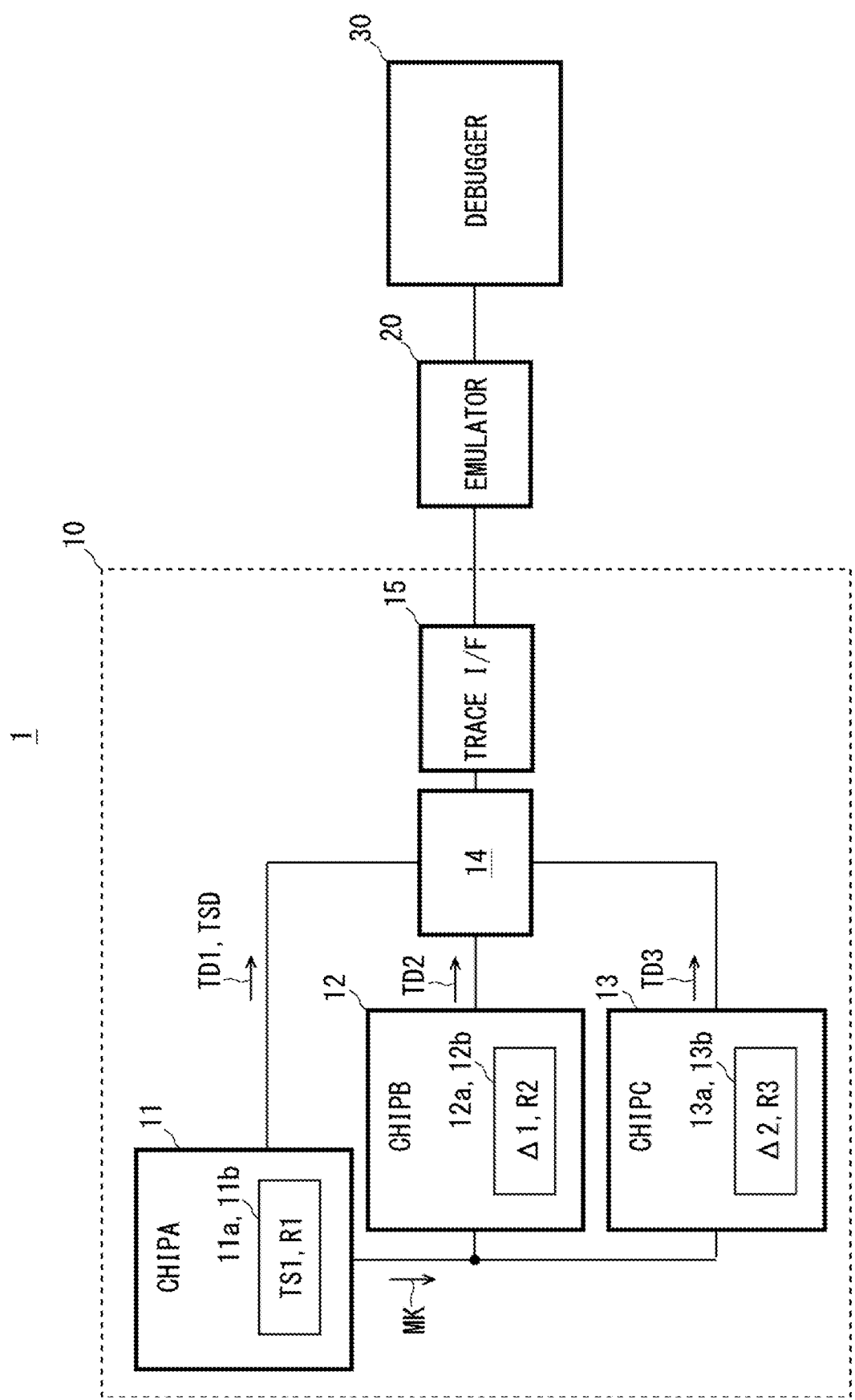
FIG. 2 is a configuration diagram illustrating a debug system according to a first embodiment.
Figure 3:
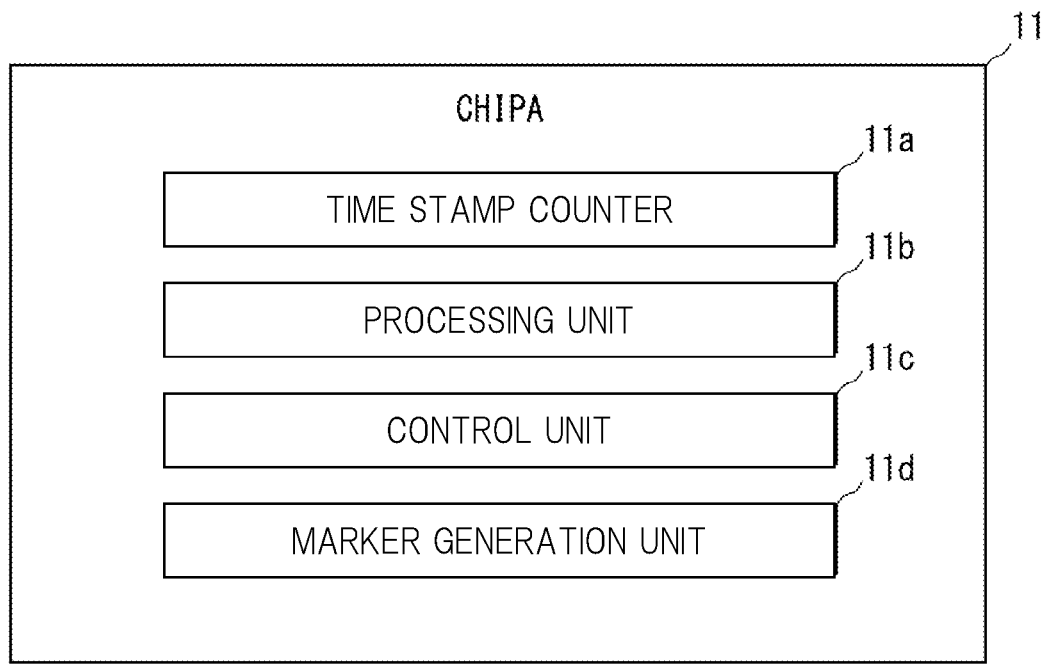
FIG. 3 is a block diagram illustrating a chip of a semiconductor device in the debug system according to the first embodiment.
Figure 4:
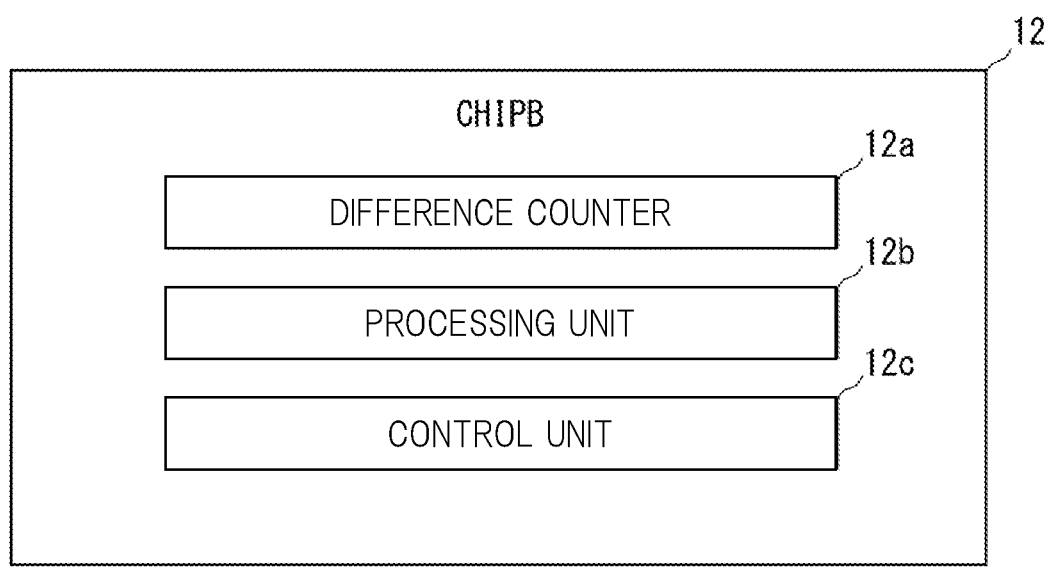
FIG. 4 is a block diagram illustrating the chip of the semiconductor device in the debug system according to the first embodiment.
Figure 5:
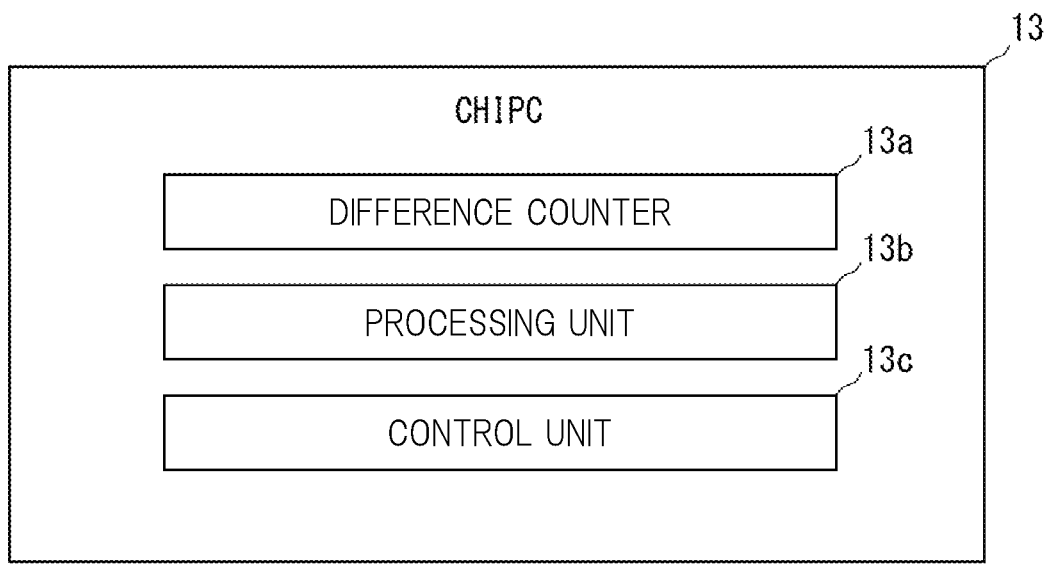
FIG. 5 is a block diagram illustrating the chip of the semiconductor device in the debug system according to the first embodiment.
Figure 6:
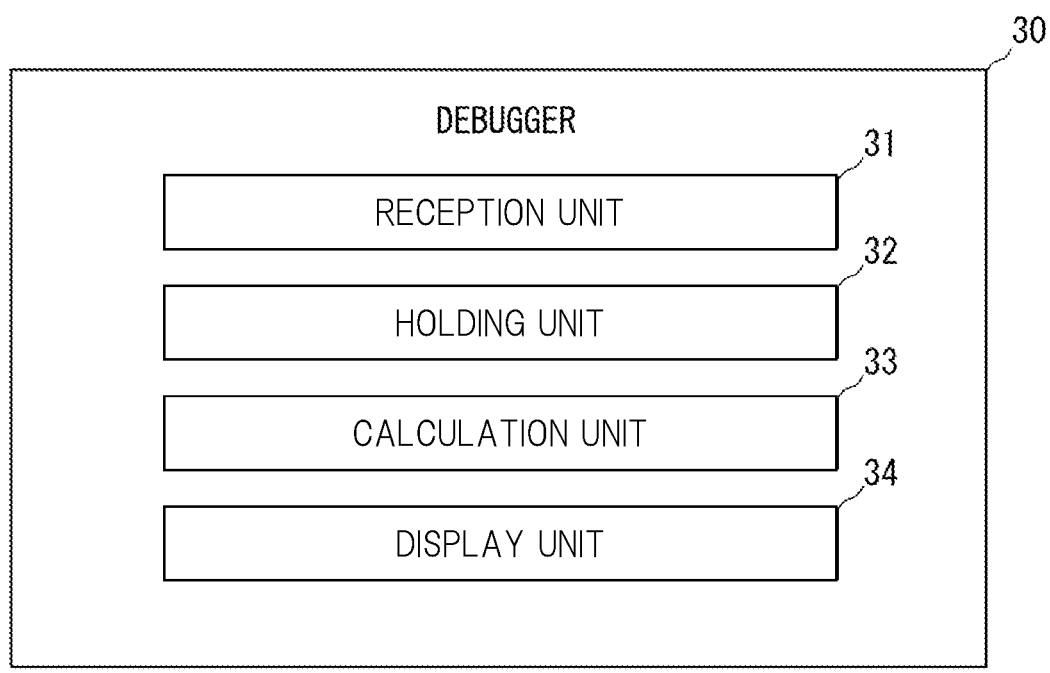
FIG. 6 is a block diagram illustrating a debugger in the debug system according to the first embodiment.

Next, a debug system of the present embodiment will be described. FIG. 2 is a configuration diagram illustrating a debug system according to a first embodiment. FIGS. 3 to 5 are block diagrams each illustrating a chip of a semiconductor device in the debug system according to the first embodiment. FIG. 6 is a block diagram illustrating a debugger in the debug system according to the first embodiment. As shown in FIG. 2, a debug system 1 includes a semiconductor device 10, an emulator 20, and a debugger 30.

The semiconductor device 10 has a plurality of chips, an arbitration circuit 14, and a trace interface 15. For example, the semiconductor device 10 includes a chiplet configuration device configured by chiplets. The chiplet configuration device mounts the plurality of chips on a substrate. The chiplet configuration device is a device configured to function as one device by connecting the plurality of chips with the substrate. The plurality of chips include, for example, a chip A11, a chip B12, and a chip C13. Incidentally, the plurality of chips are not limited to three chips, and may be two chips, or four or more chips. Also, in FIG. 2, only part of the configuration of each chip is shown so as not to complicate the drawing.

As shown in FIG. 3, the chip A11 has a time stamp counter 11a, a processing unit 11b, a control unit 11c, and a marker generation unit 11d. The chip A11 has the large-capacity time stamp counter 11a which becomes a main chip in the semiconductor device 10 of the chiplet configuration device. The time stamp counter 11a may have a larger capacity than a difference counter 12a of the chip B12 and a difference counter 13a of the chip C13.

The time stamp counter 11a sequentially counts time. The time stamp counter 11a obtains a time stamp value TS1 corresponding to a series of counted times. Then, the time stamp counter 11a holds the acquired time stamp value TS1. The time applied at the chip A11 is called, for example, a first standard time. By doing so, the time stamp counter 11a holds a series of time stamp values TS1 corresponding to the first standard time, which is obtained by sequentially counting the first standard time.

Figure 7:
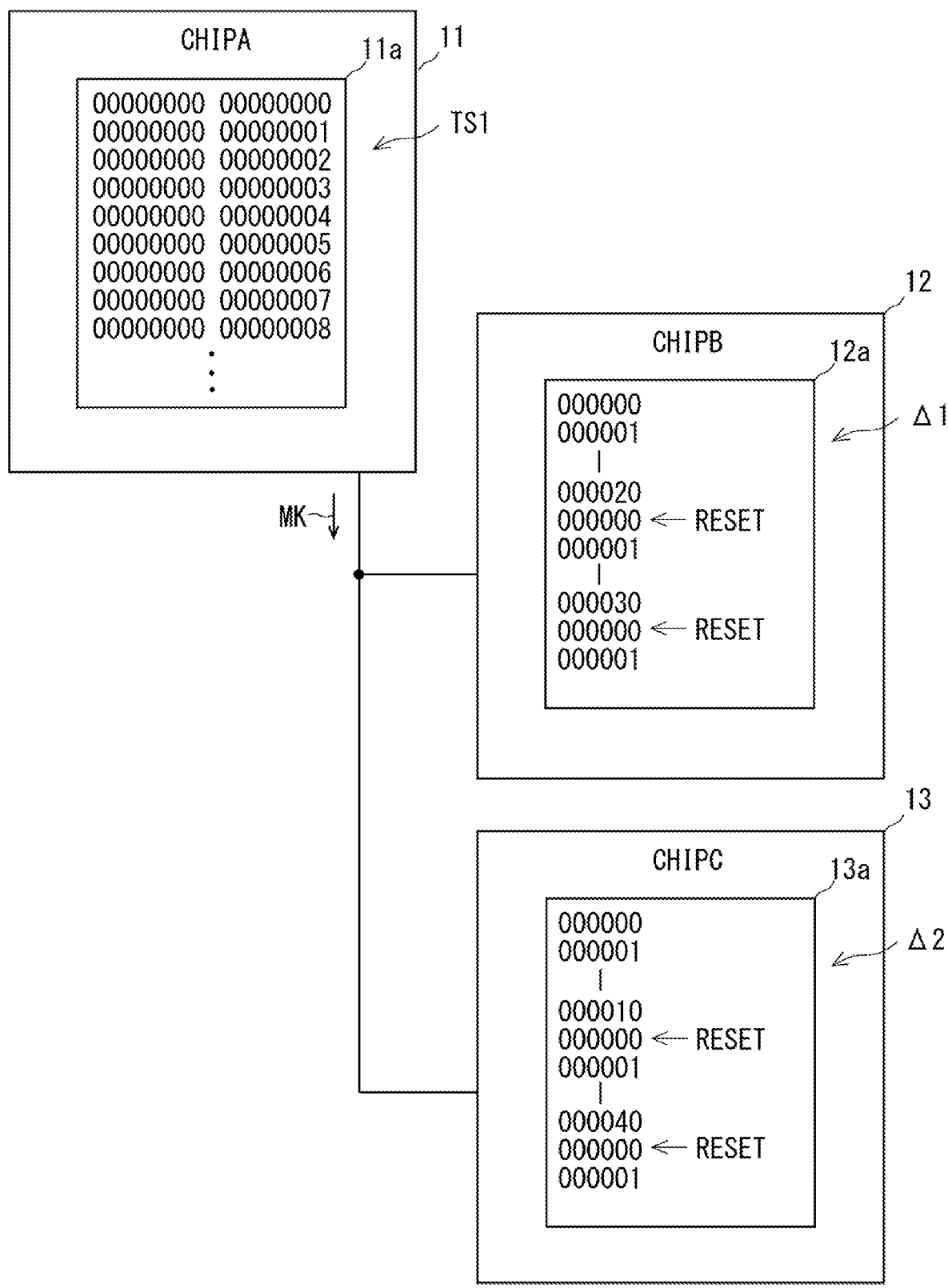
FIG. 7 is a diagram illustrating time stamp values and difference values in the debug system according to the first embodiment.

FIG. 7 is a diagram illustrating the time stamp values and the difference values in the debug system according to the first embodiment. As shown in FIG. 7, the time stamp counter 11a holds 00000000 00000000, 00000000 00000001, 00000000 00000002, . . . , 00000000 00000008, . . . as the series of time stamp values TS1 corresponding to the counted first standard time.

The processing unit 11b executes software to be debugged. An execution result obtained by the processing unit 11b executing the software is called an execution result R1. The software operating in the semiconductor device 10 including the chiplet configuration device is processed in cooperation among the chip A11, the chip B12, and the chip C13.

The control unit 11c outputs, to the arbitration circuit 14, the trace data TD1 in which the time stamp value TS1 is associated with the execution result R1. The control unit 11c also outputs time stamp data TSD, which includes the time stamp value TS1, to the arbitration circuit 14. Namely, the control unit 11c outputs, to the arbitration circuit 14, the time stamp data TSD including only the time stamp value TS1 that does not include the execution result R1.

The marker generation unit 11d generates a marker MK indicating a predetermined time of the first standard time. Then, the marker generation unit 11d outputs the generated markers MK to the chip B12 and the chip C13. When the control unit 11c outputs the time stamp data TSD and the trace data TD1 to the arbitration circuit 14, the marker generation unit 11d outputs the marker MK to the chip B12 and the chip C13.

In addition, the marker generation unit 11d monitors the difference counter 12a and the difference counter 13a, which will be described later. Specifically, the marker generation unit 11d monitors a data amount held in the difference counter 12a and difference counter 13a, an empty data amount capable of being held in the difference counter 12a and the difference counter 13a, and the like. The marker generation unit 11d outputs the marker MK to the chip B12 and the chip C13 before exceeding capacities of the difference counter 12a and the difference counter 13a. For example, the marker generation unit 11d periodically outputs the marker MK to the chip B12 and the chip C13 so that the difference counter 12a and the difference counter 13a do not overflow. The difference counter 12a and the difference counter 13a are reset when receiving the marker MK. For example, a difference value Δ1 and a difference value Δ2 held in the difference counter 12a and the difference counter 13a are reset.

As shown in FIG. 4, the chip B12 has the difference counter 12a, a processing unit 12b, and a control unit 12c. The capacity of the difference counter 12a may be smaller than that of the time stamp counter 11a.

The difference counter 12a sequentially counts time. The time applied in the chip B12 is called, for example, a second standard time. The difference counter 12a obtains a series of difference times between the second standard time and a time indicated by the marker MK outputted from the marker generation unit 11d of the chip A11. The difference counter 12a holds the obtained difference time as the difference value Δ1. That is, the difference counter 12a holds the series of difference values Δ1 between the second standard time and the marker MK, which are obtained by sequentially counting the second standard time. The difference counter 12a is reset when receiving the marker MK outputted from the marker generation unit 11d.

For example, as shown in FIG. 7, the difference counter 12a holds 000000, 000001, . . . , 000020 as the difference value Δ1. The difference counter 12a is reset when receiving the marker MK. Accordingly, the marker MK is also a reset signal. After being reset, the difference counter 12a again sequentially counts the second standard time, thereby holding the series of difference values Δ1 between the second standard time and the marker MK.

The processing unit 12b executes the software to be debugged. The execution result obtained by the processing unit 12b executing the software is called an execution result R2. The software operating on the semiconductor device 10 including the chiplet configuration device is processed in cooperation among the chip A11, the chip B12, and the chip C13. The control unit 12c outputs, to the arbitration circuit 14, the trace data TD2 in which the difference value Δ1 is associated with the execution result R2.

As shown in FIG. 5, the chip C13 has a difference counter 13a, a processing unit 13b, and a control unit 13c. The capacity of the difference counter 13a may be smaller than that of the time stamp counter 11a.

The difference counter 13a sequentially counts time. The time applied in chip C13 is called, for example, a third standard time. The difference counter 13a obtains a series of difference times between the third standard time and a time indicated by the marker MK outputted from the marker generation unit 11d of the chip A11. The difference counter 13a holds the obtained difference time as the difference value Δ2. That is, the difference counter 13a holds the series of difference values Δ2 between the third standard time and the marker MK, which are obtained by sequentially counting the third standard time. The difference counter 13a is reset when receiving the marker MK outputted from the marker generation unit 11d.

For example, as shown in FIG. 7, the difference counter 13a holds 000000, 000001, . . . , 000010 as the difference value Δ2. The difference counter 13a is reset when receiving the marker MK. Accordingly, the marker MK is also a reset signal. After being reset, the difference counter 13a sequentially counts the third standard time again, thereby holding the series of difference values Δ2 between the third standard time and the marker MK.

The processing unit 13b executes the software to be debugged. An execution result obtained by the processing unit 13b executing the software is called an execution result R3. The software operating on the semiconductor device 10 including the chiplet configuration device is processed in cooperation among the chip A11, the chip B12, and the chip C13. The control unit 13c outputs, to the arbitration circuit 14, trace data TD3 in which the difference value Δ2 is associated with the execution result R3.

The arbitration circuit 14 outputs the time stamp data TSD, trace data TD1, trace data TD2 and trace data TD3 to the trace interface 15. When receiving the time stamp data TSD, the trace data TD1 to TD3, and the like from the control units 11c to 13c, the arbitration circuit 14 determines output order according to priority order. For example, the arbitration circuit 14 may output the trace data TD1 to TD3 and the like received at the same time in predetermined order. For example, the arbitration circuit 14 may output the trace data TD1 (including time stamp data TSD)→the trace data TD2→the trace data TD3 in this order.

The trace interface 15 outputs the time stamp data TSD, the trace data TD1, the trace data TD2, and the trace data TD3, which are outputted by the arbitration circuit 14, from output terminals. The trace interface 15 outputs time stamp data TSD, the trace data TD1, the trace data TD2, and the trace data TD3 to the debugger 30 via the emulator 20.

Figure 8:
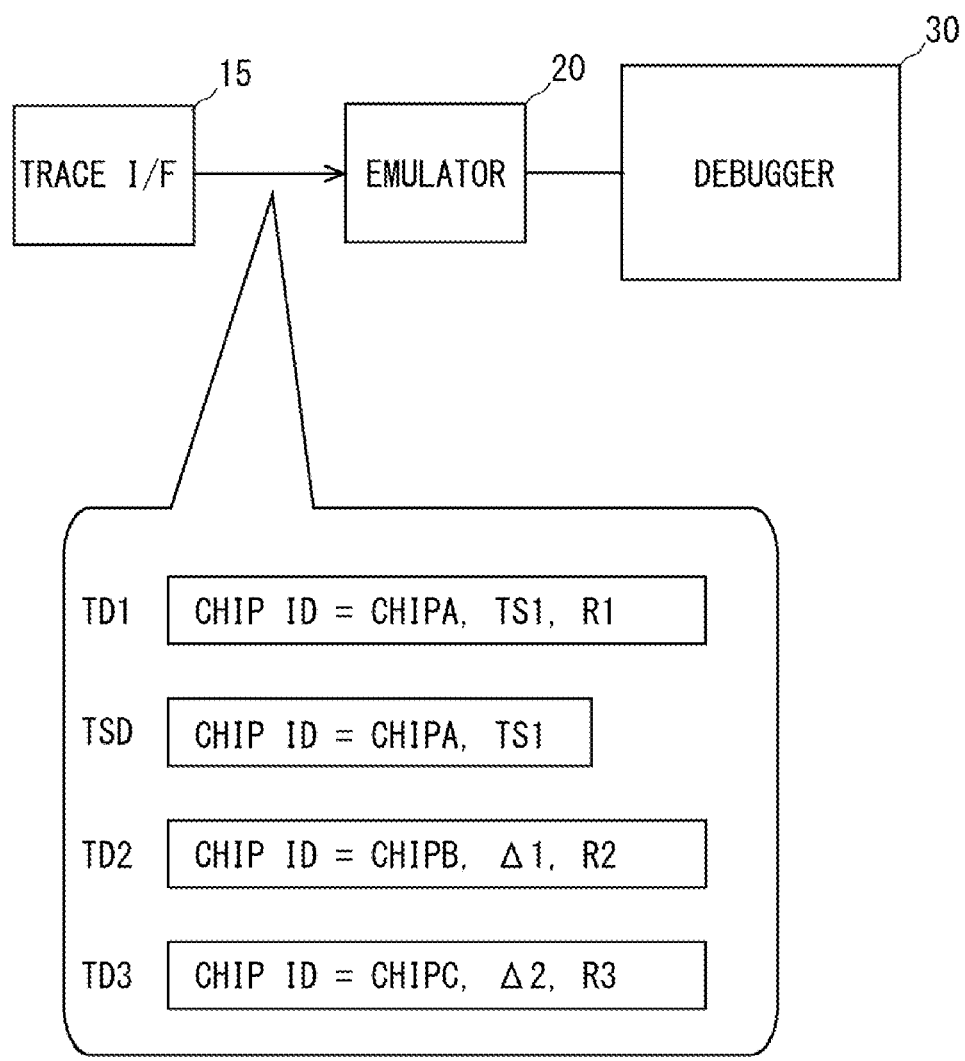
FIG. 8 is a diagram illustrating time stamp data and trace data in the debug system according to the first embodiment.

FIG. 8 is a diagram illustrating a time stamp data TSD, trace data TD1, trace data TD2, and trace data TD3 in the debug system according to the first embodiment. As shown in FIG. 8, the trace interface 15 outputs the time stamp data TSD, the trace data TD1, the trace data TD2, and the trace data TD3 from the output terminals to the debugger 30 via the emulator 20. The number of output terminals may be one, or two or more in some cases.

The trace data TD1 includes an Identification (ID) for identifying the chip A11, the time stamp value TS1, and the execution result R1 obtained by the processing unit 11$b$ executing the software. The execution result R1 includes branches and data accesses in executing the software. The time stamp data TSD includes an ID for identifying the chip A11 and the time stamp value TS1. The trace data TD2 includes an ID for identifying the chip B12, the difference value $\Delta$1, and the execution result R2 obtained by the processing unit 12$b$ executing the software. The trace data TD3 includes an ID for identifying the chip C13, the difference value $\Delta$2, and the execution result R3 obtained by the processing unit 13$b$ executing the software.

The emulator 20 delivers the time stamp data TSD, the trace data TD1, the trace data TD2, and the trace data TD3, which are received from the trace interface 15, to the debugger 30.

The debugger 30 debugs the software executed by the semiconductor device 10. As shown in FIG. 6, the debugger 30 has a reception unit 31, a holding unit 32, a calculation unit 33, and a display unit. The reception unit 31 receives the time stamp data TSD, the trace data TD1, the trace data TD2, and the trace data TD3 via the emulator 20.

The holding unit 32 holds the time stamp value TS1, which is included in the time stamp data TSD, as a reference time. Namely, the time stamp value TS1 included in the time stamp data TSD is held in the debugger 30 as a reference time. The holding unit 32 updates the reference time to the time stamp value TS1 included in the next time stamp data TSD when the next time stamp data TSD is outputted from the control unit 11$c$. In other words, when the next time stamp data TSD is outputted from the control unit 11$c$, the debugger 30 updates the reference time to the time stamp value TS1 included in the next time stamp data TSD.

The holding unit 32 holds a frequency of an operating clock of each chip. Specifically, for example, the operating clock of the chip A11 is a first frequency. The operating clock of the chip B12 is a second frequency. The operating clock of the chip C13 is a third frequency. In this case, the holding unit 32 holds the first frequency of the operating clock of the chip A11, the second frequency of the operating clock of the chip B12, and the third frequency of the operating clock of the chip C13. Incidentally, the first frequency, the second frequency, and the third frequency may all be different frequencies, or all may be the same frequency. Also, some frequencies may be the same frequency, and some frequencies may be different frequencies.

The calculation unit 33 calculates the time stamp value TS2 based on the time stamp value TS1 included in the time stamp data TSD and the difference value $\Delta$1 included in the trace data TD2. The time stamp value TS2 corresponds to the first standard time. Then, the calculation unit 33 associates the calculated time stamp value TS2 with the execution result R2 obtained by the processing unit 12$b$ executing the software. In this way, the execution result R2 is associated with a series of time stamp values TS2 calculated in the debugger 30 based on the time stamp value TS1 included in the time stamp data TSD and the difference value $\Delta$1 included in the trace data TD2. be associated.

Further, the calculation unit 33 calculates the time stamp value TS3 based on the time stamp value TS1 included in the time stamp data TSD and the difference value $\Delta$2 included in the trace data TD3. The time stamp value TS3 corresponds to the first standard time. Then, the calculation unit 33 associates the calculated time stamp value TS3 with the execution result R3 obtained by the processing unit 13$b$ executing the software. In this way, the execution result R3 is associated with a series of time stamp values TS3 calculated in the debugger 30 based on the time stamp value TS1 included in the time stamp data TSD and the difference value $\Delta$2 included in the trace data TD3.

When the frequencies of the operating clocks of the respective chips are different, the calculation unit 33 converts the difference value $\Delta$1 included in the trace data TD2 into a time interval of the first standard time based on the first frequency and the second frequency. The calculation unit 33 calculates a series of time stamp values TS2 corresponding to the first standard time based on the converted time interval and the reference time. Then, the calculation unit 33 associates the execution result R2, which is obtained by the processing unit 12$b$ executing the software, with the time stamp value TS2.

Also, the calculation unit 33 converts the difference value $\Delta$2 included in the trace data TD3 into a time interval of the first standard time based on the first frequency and the third frequency. The calculation unit 33 calculates a series of time stamp values TS3 corresponding to the first standard time based on the converted time interval and the reference time. Then, the calculation unit 33 associates the execution result R3, which is obtained by the processing unit 13$b$ executing the software, with the time stamp value TS3.

In this way, the difference value $\Delta$1 included in the trace data TD2 is converted into the time interval of the first standard time by the debugger 30 based on the first frequency and the second frequency. The difference value $\Delta$2 included in the trace data TD3 is converted into the time interval of the first standard time by the debugger 30 based on the first frequency and the third frequency. Accordingly, the execution result R2 obtained by the processing unit 12$b$ executing the software is associated with the time stamp value TS2 calculated in the debugger 30 based on the converted time interval and the reference time. The execution result R3 obtained by the processing unit 13$b$ executing the software is associated with the time stamp value TS3 in the debugger 30 based on the converted time interval and the reference time.

A display unit 34 displays the time stamp data TSD, the trace data TD1, the trace data TD2, and the trace data TD3. The display unit 34 also displays the execution result R2 associated with the time stamp value TS2 and the execution result R3 associated with the time stamp value TS3.

Figure 9:
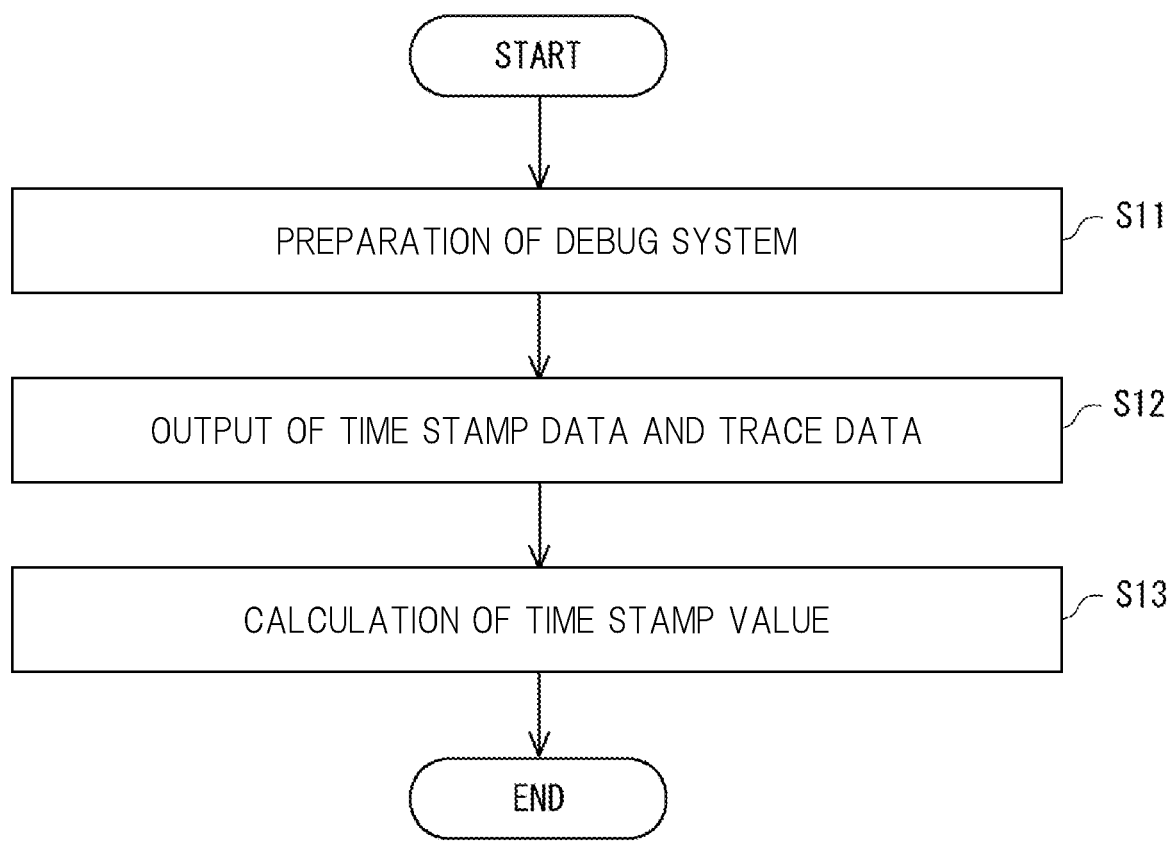
FIG. 9 is a flowchart illustrating a debug method according to the first embodiment.

Next, a debug method using the debug system 1 will be described. FIG. 9 is a flowchart diagram illustrating a debug method according to the first embodiment. As shown in FIG. 9, a debug method of the present embodiment includes a step S11 of preparing the debug system 1, a step S12 of outputting the time stamp data TSD and the trace data TD1 to TD3, and a step S13 of calculating time stamps TS2 and TS3.

First, in step S11, the debug system 1 including the semiconductor device 10 and the debugger 30 is prepared. The semiconductor device 10 has the plurality of chips including the chip A11, the chip B12, and the chip C13 arranged on the substrate, the arbitration circuit 14, and the trace interface 15. The debugger 30 debugs the software executed by the semiconductor device 10.

Figure 10:
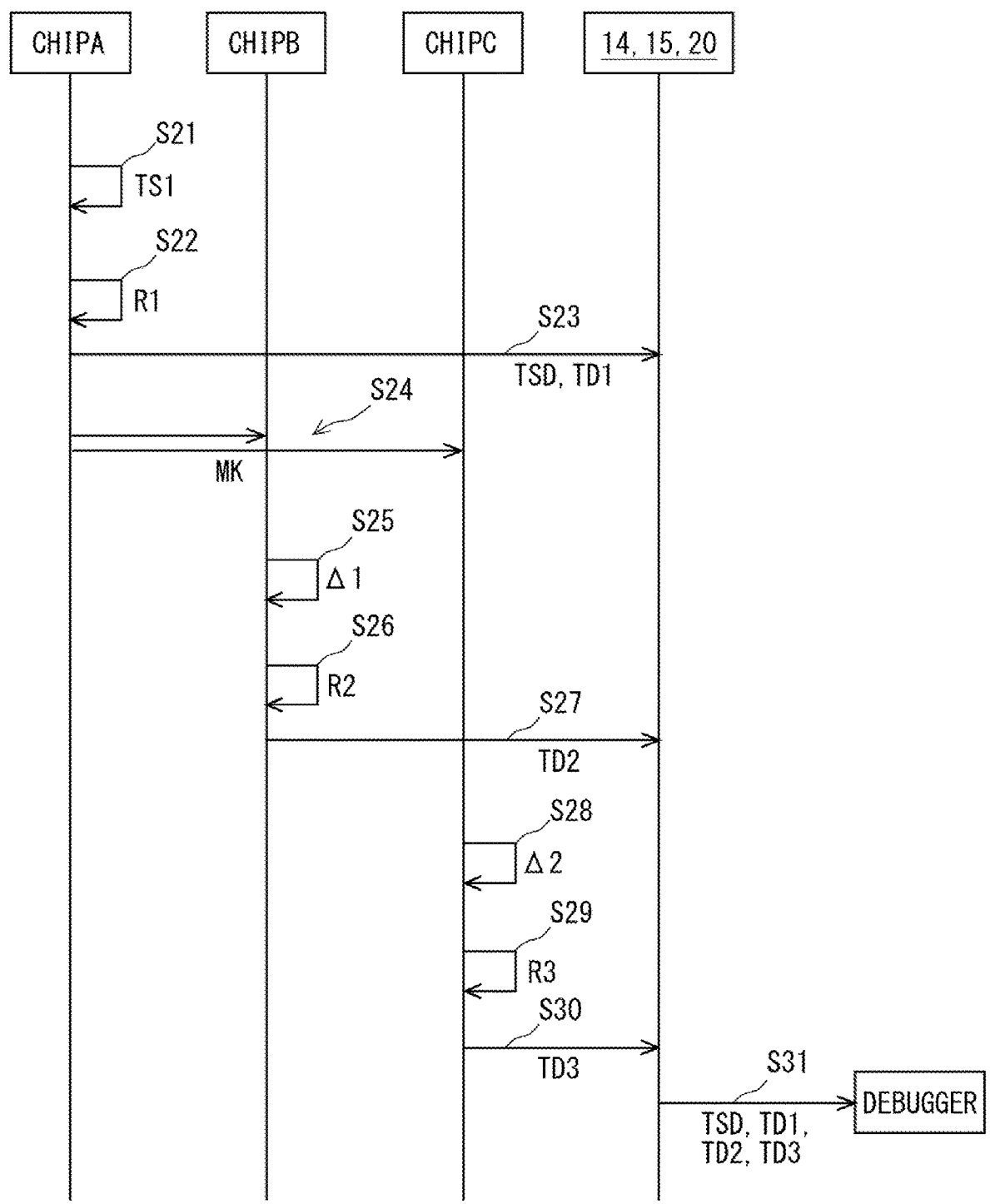
FIG. 10 is a sequence diagram illustrating a method of outputting the time stamp data and the trace data in the debug method according to the first embodiment.

Next, in step S12, the time stamp data TSD and the trace data TD1 to TD3 are outputted. FIG. 10 is a sequence diagram illustrating a method of outputting the time stamp data TSD and the trace data TD1 to TD3 in the debug method according to the first embodiment. As shown in step S21 of FIG. 10, in the chip A11, a series of time stamp values TS1, which is obtained by sequentially counting the first standard time and corresponds to the first standard time, is held by the time stamp counter 11a.

Next, as shown in step S22, in the chip A11, the software is exerted, and the execution result R1 of the software is acquired by the processing unit 11b.

Next, as shown in step S23, in the chip A11, the time stamp data TSD including the time stamp value TS1 and the trace data TD1 in which the time stamp value TS1 is associated with the execution result R1 obtained by executing the software is outputted to the arbitration circuit 14 by the control unit 11c.

Next, as shown in step S24, in the chip A11, the marker generation unit 11d is caused to generate the marker MK indicating the predetermined time of the first standard time, and the marker generation unit 11d is caused to generate the marker MK for the chip B12 and the chip C13. In outputting the marker MK, the marker MK may be outputted to the chip B12 and the chip C13 in the chip A11 when the time stamp data TSD and the trace data TD1 are outputted. Also, in the chip A11, the difference counters 12a and 13a that hold the difference values in the chip B12 and the chip C13 are monitored, and the marker MK may be outputted to the chip B12 and the chip C13 before exceeding the capacity of the difference counters 12a and 13a. In this case, in the chip B12 and the chip C13, the difference counters 12a and 13a are reset when the marker MK is received.

Next, as shown in step S25, in the chip B12, the series of difference values Δ1 between the second standard time and the marker MK, which is obtained by sequentially counting the second standard time, is held by the difference counter 12a.

Next, as shown in step S26, in the chip B12, the software is executed, and the execution result R2 obtained by executing the software is acquired by the processing unit 12b.

Next, as shown in step S27, in the chip B12, the trace data TD2 in which the difference value Δ1 is associated with the execution result R2 obtained by executing the software is outputted to the arbitration circuit 14 by the control unit 12c.

Next, as shown in step S28, in the chip C13, a series of difference values Δ2 between the third standard time and the marker MK, which are obtained by sequentially counting the third standard time is held by the difference counter 13a.

Next, as shown in step S29, in the chip C13, the software is exerted, and the execution result R3 obtained by executing the software is acquired by the processing unit 13b.

Next, as shown in step S30, in the chip C13, the trace data TD3 in which the difference value Δ2 is associated with the execution result R3 obtained by executing the software is outputted to the arbitration circuit 14 by the control unit 13c.

Next, as shown in step S31, in the arbitration circuit 14, the time stamp data TDS, the trace data TD1, the trace data TD2, and the trace data TD3 are outputted by the trace interface 15. Then, in the trace interface 15, the time stamp data TDS, the trace data TD1, the trace data TD2, and the trace data TD3 are outputted to the debugger 30 via the emulator 20.

Figure 11:
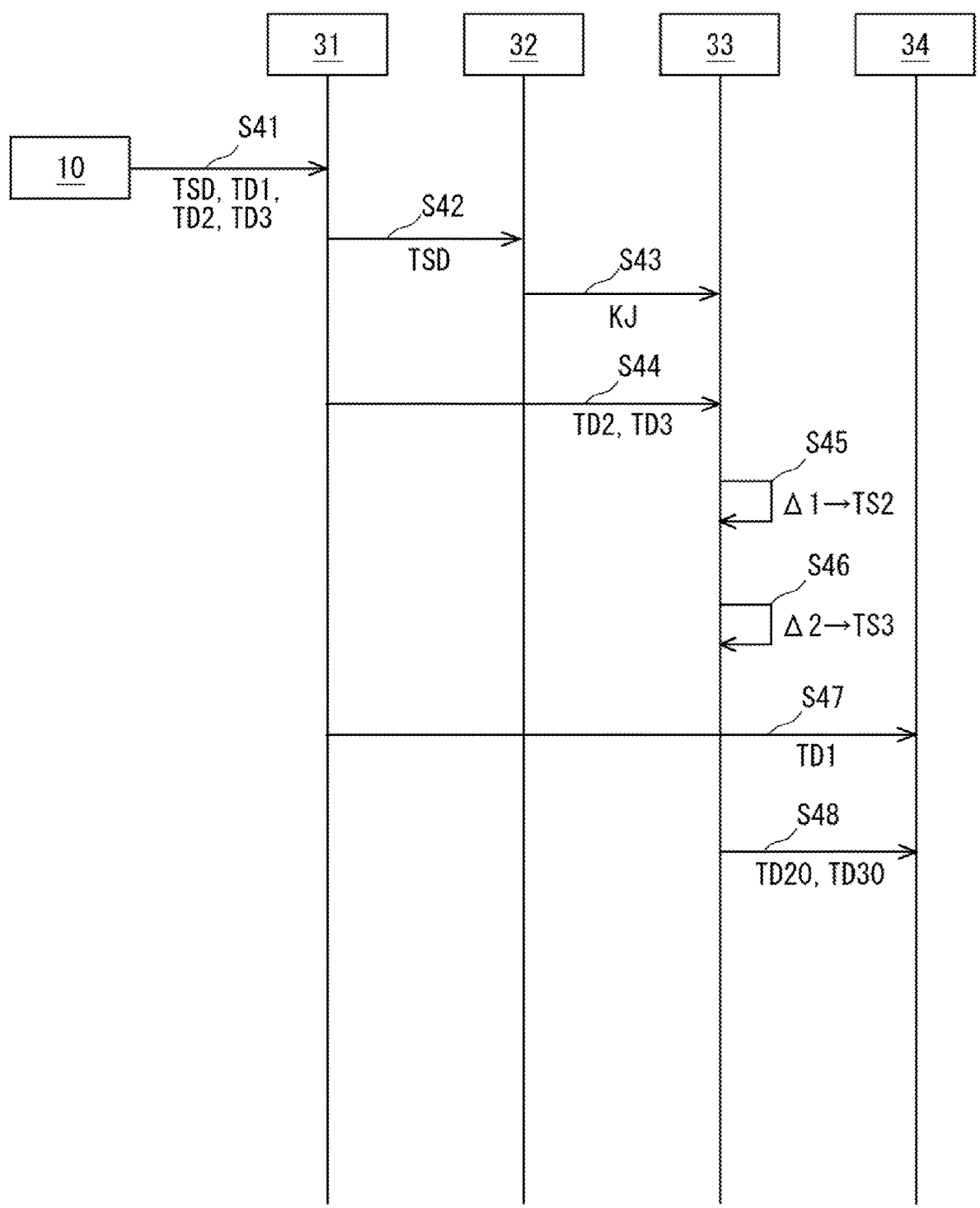
FIG. 11 is a sequence diagram illustrating a method of calculating the time stamp data in the debug method according to the first embodiment.

FIG. 11 is a sequence diagram illustrating a method of calculating time stamp data in the debug method according to the first embodiment.

As shown in step S41 of FIG. 11, in the debugger 30, the reception unit 31 is caused to receive the time stamp data TDS, the trace data TD1, the trace data TD2, and the trace data TD3 via the emulator 20.

Next, as shown in step S42, in the debugger 30, the holding unit 32 may be caused to hold, as a reference time KJ, the time stamp value TS1 included in the time stamp data TSD. Then, when the next time stamp data TSD is outputted from the chip A11, to the holding unit 32 may be caused to update the reference time KJ to the time stamp value TS1 included in the next time stamp data TSD. Further, the holding unit 32 may be caused to hold the first frequency of the operating clock of the chip A11, the second frequency of the operating clock of the chip B12, and the third frequency of the operating clock of the chip C13.

Next, as shown in step S43, in the debugger 30, the holding unit 32 is caused to output the reference time and each frequency to the calculation unit 33.

Next, as shown in step S44, in the debugger 30, the reception unit 31 is caused to output the trace data TD2 and TD3 to the calculation unit 33.

Next, as shown in step S45, in the debugger 30, the calculation unit 33 is caused to calculate a series of time stamp values TS2 corresponding to the first standard time based on the time stamp value TS1 included in the time stamp data TSD and on the difference value Δ1 included in the trace data TD2. When calculating the time stamp value TS2, the difference value Δ1 included in the trace data TD2 may be converted into the time interval of the first standard time based on the first frequency and the second frequency. Then, a series of time stamp values TS2 corresponding to the first standard time may be calculated based on the time interval and the reference time KJ. Thereafter, in the calculation unit 33, the time stamp value TS2 is associated with the execution result R2 obtained by the chip B12 executing the software.

Similarly, as shown in step S46, in the debugger 30, the calculation unit 33 is caused to calculate a series of time stamp values TS3 corresponding to the first standard time based on the time stamp value TS1 included in the time stamp data TSD and the difference value Δ2 included in the trace data TD3. When calculating the time stamp value TS3, the difference value Δ2 included in the trace data TD3 may be converted into the time interval of the first standard time based on the first frequency and the third frequency. Then, a series of time stamp values TS3 corresponding to the first standard time may be calculated based on the time interval and the reference time KJ. Thereafter, in the calculation unit 33, the time stamp value TS3 is associated with the execution result R3 obtained by the chip C13 executing the software.

Next, as shown in step S47, in the display unit 34 of the debugger 30, the trace data TD1 is displayed. The trace data TD1 is obtained by associating the time stamp value TS1 with the execution result R1 obtained by the chip A11 executing the software. Further, as shown in step S48, in the display unit 34, the trace data TD20 and the trace data TD30 are displayed. The trace data TD20 is obtained by associating the time stamp value TS2 with the execution result R2 obtained by the chip B12 executing the software. The trace data TD30 is obtained by associating the time stamp value TS3 with the execution result R3 obtained by the chip C13 executing the software.

The time stamp value TS1, the time stamp value TS2, and the time stamp value TS3 correspond to the first standard time. Accordingly, the debugger 30 can synchronize the respective time stamp values of the respective chips.

Next, effects of the present embodiment will be described. In the debug system 1 of the present embodiment, the execution results R1 to R3 obtained by the respective chips executing the software are associated with the synchronized time stamp values TS1 to TS3. Accordingly, in debugging, the context of the execution results R1 to R3 of the software by the respective chips can be clarified.

Also, the data amounts of the trace data TD1 to TD3 transmitted from the semiconductor device 10 to the debugger 30 can be reduced. This makes it possible to suppress the loss of the trace data TD1 to TD3 even if the output terminals of the trace interface 15 are limited.

For example, as a premise, when the number of chips is n, it is assumed that each piece of trace data is outputted from each chip once. A case where a width of the timestamp value is 64 bits, the difference value is 16 bits, and the data of the execution result of the software is 128 bits will be considered.

1. Case of 3 Chips (n=3)

Comparative Example (Time stamp value 64 bits×3)+(Data 128 bits×3)=578 bits

Present Embodiment (Time stamp value 64 bits×1)+(Difference value 16 bits×2)+(Data 128 bits×3)=480 bits Accordingly, the transfer amount of the trace data is improved by 20%.

2. Case of 5 chips (n=5)

Comparative Example (Time stamp value 64 bits×5)+(Data 128 bits×5)=960 bits

Present Embodiment (Time stamp value 64 bits×1)+(Difference value 16 bits×4)+(Data 128 bits×5)=768 bits Accordingly, the transfer amount of the trace data is improved by 25%.

3. Case of 7 chips (n=7)

Comparative Example (Time stamp value 64 bits×7)+(Data 128 bits×7)=1344 bits

Present Embodiment (Time stamp value 64 bits×1)+(Difference value 16 bits×6)+(Data 128 bits×7)=1056 bits Accordingly, the transfer amount of the trace data is improved by 27%.

4. Case of 2 chips (n=2)

Comparative Example (Time stamp value 64 bits×2)+(data 128 bits×2)=384 bits

Present Embodiment (Time stamp value 64 bits×1)+(Difference value 16 bits×1)+(Data 128 bits×2)=336 bits In this case as well, the transfer amount of the trace data is improved. In this way, according to the present embodiment, the transfer amount of the data can be improved in comparison with the comparative example.

Second Embodiment

Next, before describing a debug system according to a second embodiment, problems of the debug system 1 according to the first embodiment will be described. Problem 1 is as follows. That is, in the debug system 1 of the first embodiment, the semiconductor device 10 needs to newly develop chips for the arbitration circuit 14 and the trace interface 15. In addition, problem 2 is as follows. That is, in the debug system 1 of the first embodiment, the semiconductor device 10 needs to have a large number of wirings for the trace data. Specifically, the chip A11, chip B12, chip C13, and the arbitration circuit 14 are connected therebetween by wirings for the trace data on the chiplet. Consequently, the number of wirings on the chiplet becomes large, and an area of the semiconductor device 10 having the chiplet structure increases. For example, the number of wirings requires the trace data's wirings 192×3 systems=576 wirings.

Therefore, the debug system of the present embodiment incorporates the arbitration circuit 14 and the trace interface 15 in the chip A11. This does not need to arrange the arbitration circuit 14 and the trace interface 15 on the substrate in the configuration of the chiplet. Accordingly, the number of wires between the chips A11, B12 and C13 and the arbitration circuit 14 can be reduced.

Figure 12:
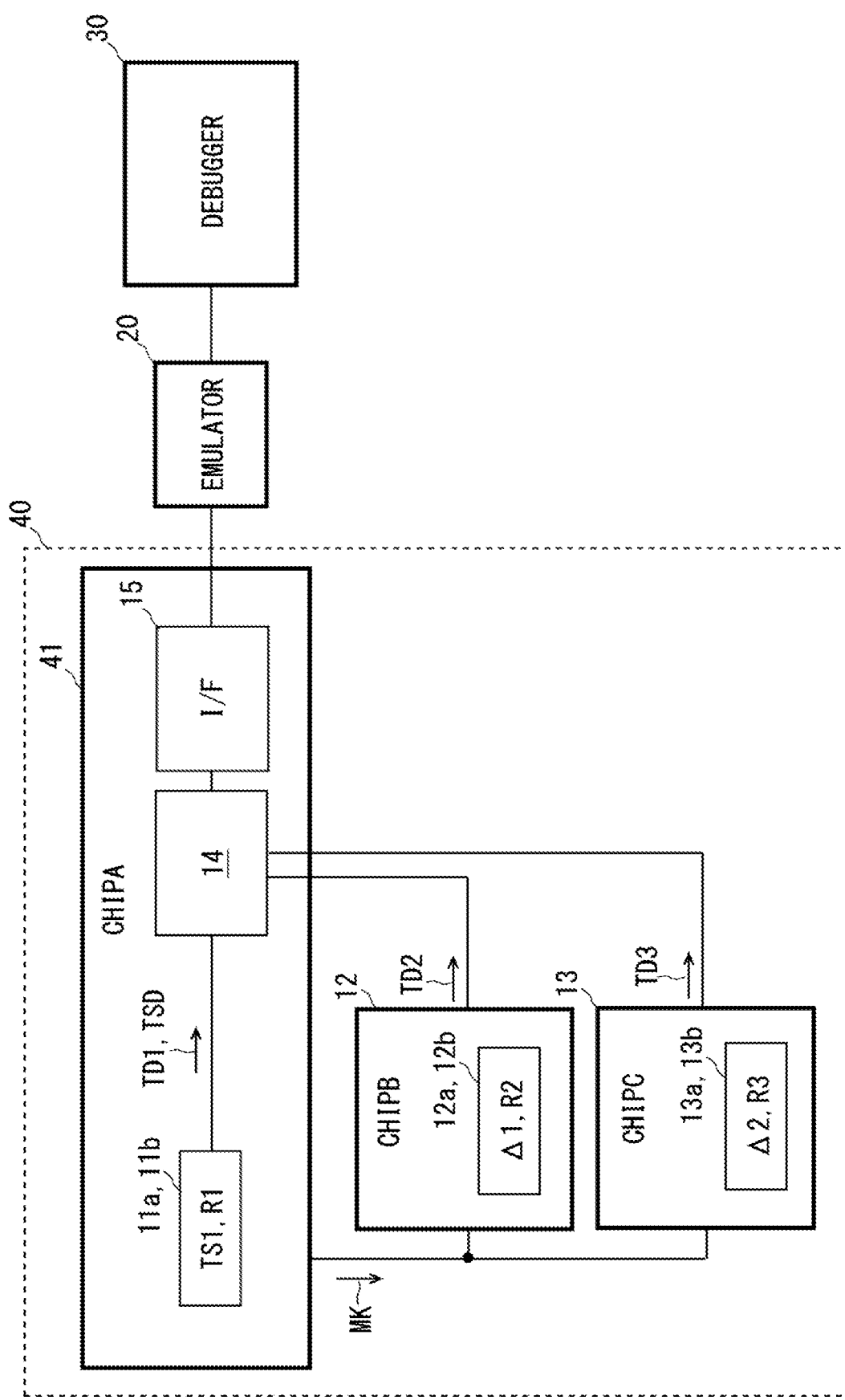
FIG. 12 is a configuration diagram illustrating a debug system according to a second embodiment.
Figure 13:
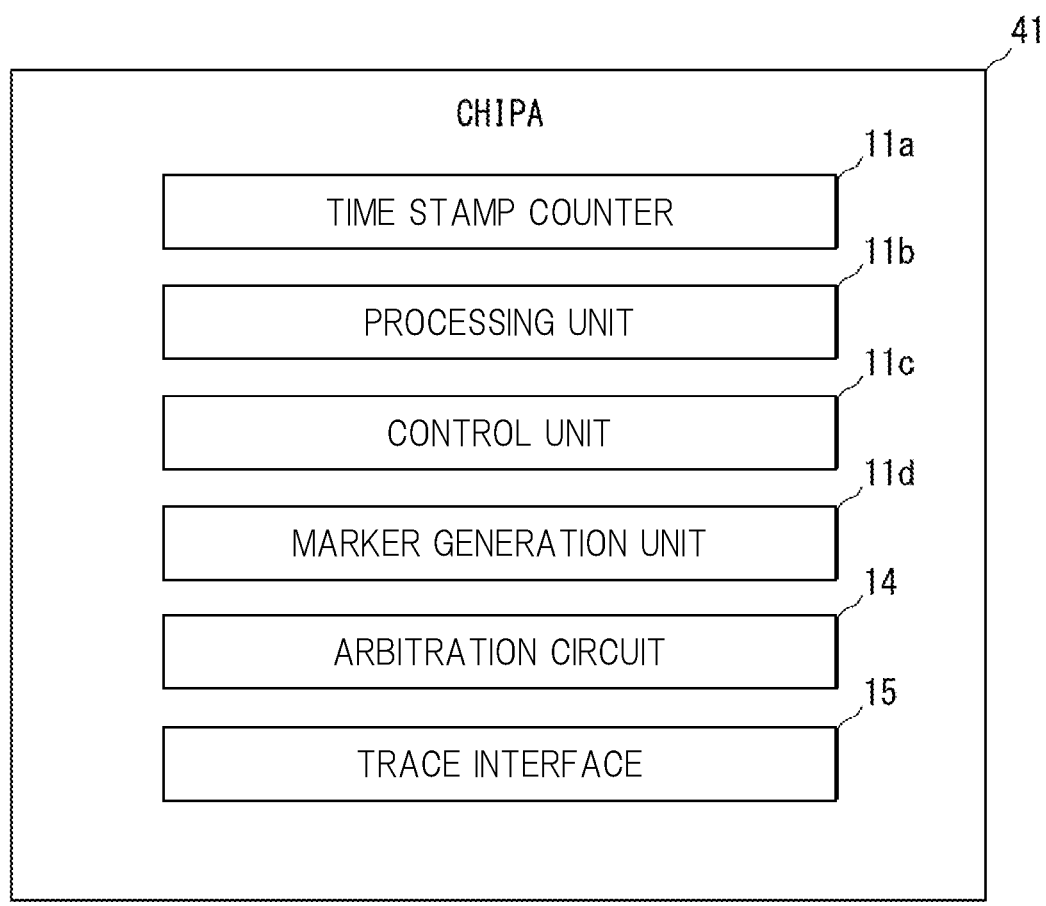
FIG. 13 is a block diagram illustrating a chip of a semiconductor device in the debug system according to the second embodiment.

FIG. 12 is a configuration diagram illustrating the debug system according to the second embodiment. FIG. 13 is a block diagram illustrating a chip of a semiconductor device in a debug system according to the second embodiment. As shown in FIGS. 12 and 13, a debug system 2 of the present embodiment includes a semiconductor device 40, an emulator 20, and a debugger 30. The semiconductor device 40 includes a plurality of chips arranged on a substrate. The plurality of chips include, for example, chip A41, chip B12, and chip C13.

The chip A41 has the arbitration circuit 14 and the trace interface 15 in addition to the configuration of the chip A11. Namely, the chip A41 has the time stamp counter 11a, the processing unit 11b, the control unit 11c, the marker generation unit 11d, the arbitration circuit 14, and the trace interface 15. The arbitration circuit 14 and the trace interface 15 are arranged on chip A41. Other configurations and operations of the debug system 2 are the same as those of the debug system 1 of the first embodiment.

According to the present embodiment, by integrating the arbitration circuit 14 and the trace interface 15 into the chip A41, the chips for the arbitration circuit 14 and the trace interface 15 can be eliminated. Moreover, the wiring on the chiplet between the chip A41 and the arbitration circuit 14 can be made unnecessary, and the number of wirings on the chiplet can be reduced.

The invention made by the present inventors has been specifically described above based on the embodiments, but the present invention is not limited to the above-mentioned embodiments and, needless to say, can be variously modified without departing from the scope of the invention. A combination of the configurations of the first and second embodiments is also within the scope of the technical idea.

What is claimed is:

1. A semiconductor device comprising:
a plurality of chips including a first chip and a second chip arranged on a substrate;
an arbitration circuit; and
a trace interface,
wherein the first chip has:
   a time stamp counter holding a series of first time stamp values, which is obtained by sequentially counting a first standard time and corresponds to the first standard time;
   a marker generation unit generating a marker indicating a predetermined time of the first standard time and outputting the marker to the second chip;
   a first processing unit executing software to be debugged; and
   a first control unit outputting, to the arbitration circuit, time stamp data including the first time stamp value and first trace data in which the first time stamp value is associated with an execution result obtained by the first processing unit executing the software,
wherein the second chip has:
   a difference counter holding a series of difference values between a second standard time and the marker, which is obtained by sequentially counting the second standard time;
   a second processing unit executing the software; and
   a second control unit outputting, to the arbitration circuit, second trace data in which the difference values are associated with an execution result obtained by the second processing unit executing the software,
wherein the arbitration circuit outputs the time stamp data, the first trace data, and the second trace data to the trace interface,
wherein the trace interface outputs the time stamp data, the first trace data, and the second trace data to a debugger, which debugs the software, via an emulator, and
wherein the execution result obtained by the second processing unit executing the software is, in the debugger, a second time stamp value calculated based on the first time stamp value included in the time stamp data and on the difference value included in the second trace data, the execution result being associated with the series of second time stamp values corresponding to the first standard time.

2. The semiconductor device according to claim 1,
wherein the marker generation unit outputs the marker to the second chip when the first control unit outputs the time stamp data and the first trace data.

3. The semiconductor device according to claim 1,
wherein the marker generation unit monitors the difference counter, and outputs the marker to the second chip before exceeding capacity of the difference counter, and wherein the difference counter is reset when receiving the marker.

4. The semiconductor device according to claim 1,
wherein the first time stamp value included in the time stamp data is held as a reference time in the debugger.

5. The semiconductor device according to claim 4,
wherein when the next time stamp data is outputted from the first control unit, the reference time is updated to the first time stamp value included in the next time stamp data.

6. The semiconductor device according to claim 4,
wherein an operating clock of the first chip is a first frequency,
wherein an operating clock of the second chip is a second frequency,
wherein the difference value included in the second trace data is converted into a time interval of the first standard time based on the first frequency and the second frequency in the debugger, and
wherein the execution result obtained by the second processing unit executing the software is associated with the second time stamp value calculated based on the time interval and the reference time in the debugger.

7. The semiconductor device according to claim 1,
wherein the arbitration circuit and the trace interface are arranged on the first chip.

8. A debug system comprising:
a semiconductor device; and
a debugger debugging software executed by the semiconductor device,
wherein the semiconductor device has:
   a plurality of chips including a first chip and a second chip arranged on a substrate;
   an arbitration circuit; and
   a trace interface,
wherein the first chip has:
   a time stamp counter holding a series of first time stamp values, which is obtained by sequentially counting a first standard time and corresponds to the first standard time;
   a marker generation unit generating a marker indicating a predetermined time of the first standard time and outputting the marker to the second chip;
   a first processing unit executing the software; and
   a first control unit outputting, to the arbitration circuit, time stamp data including the first time stamp value and first trace data in which the first time stamp value is associated with an execution result obtained by the first processing unit executing the software,
wherein the second chip has:
   a difference counter holding a series of difference values between a second standard time and the marker, which is obtained by sequentially counting the second standard time;
   a second processing unit executing the software; and
   a second control unit outputting, to the arbitration circuit, second trace data in which the difference values are associated with the execution result obtained by the second processing unit executing the software,
wherein the arbitration circuit outputs the time stamp data, the first trace data, and the second trace data to the trace interface,
wherein the trace interface outputs the time stamp data, the first trace data, and the second trace data to the debugger via an emulator, wherein the debugger has:
  a reception unit receiving the time stamp data, the first trace data, and the second trace data via the emulator; and
  a calculation unit calculating a series of second time stamp values, which corresponds to the first standard time, based on the first time stamp value included in the time stamp data and the difference value included in the second trace data, and
wherein the calculation unit associates the calculated second time stamp value with the execution result obtained by the second processing unit executing the software.

9. The debug system according to claim 8,
wherein the marker generation unit outputs the marker to the second chip when the first control unit outputs the time stamp data and the first trace data.

10. The debug system according to claim 8,
wherein the marker generation unit monitors the difference counter, and outputs the marker to the second chip before executing capacity of the difference counter, and
wherein the difference counter is reset when receiving the marker.

11. The debug system according to claim 8,
wherein the debugger further has a holding unit holding the first time stamp value included in the time stamp data as a reference time.

12. The debug system according to claim 11,
wherein the holding unit updates the reference time to the first time stamp value included in the next time stamp data when the next time stamp data is outputted from the first control unit.

13. The debug system according to claim 11,
wherein the holding unit holds a first frequency of an operating clock of the first chip and a second frequency of an operating clock of the second chip, and
wherein the calculation unit:
  converts the difference values included in the second trace data into a time interval of the first standard time based on the first frequency and the second frequency;
  calculates a series of second time stamp values corresponding to the first standard time based on the time interval and the reference time; and
  associates the second time stamp value with the execution result obtained by the second processing unit executing the software.

14. The debug system according to claim 8,
wherein the arbitration circuit and the trace interface are arranged on the first chip.

15. A debug method comprising:
preparing a debug system;
  the debug system including:
    a semiconductor device; and
    a debugger debugging software executed by the semiconductor device,
  the semiconductor device having:
    a plurality of chips including a first chip and a second chip arranged on a substrate;
    an arbitration circuit; and
    a trace interface,
causing the first chip to:
  hold a series of first time stamp values, which is obtained by sequentially counting the first standard time and corresponds to the first standard time,
  generate a marker indicating a predetermined time of the first standard time, and output the marker to the second chip;
  execute the software; and
  output, to the arbitration circuit, time stamp data including the first time stamp value, and first trace data in which the first time stamp value is associated with an execution result obtained by executing the software;
causing the second chip to:
  hold a series of difference values between a second standard time and the marker, which is obtained by sequentially counting the second standard time;
  execute the software; and
  output, to the arbitration circuit, second trace data in which the difference values are associated with the execution result obtained by executing the software;
causing the arbitration circuit to:
  output the time stamp data, the first trace data, and the second trace data to the trace interface,
causing the trace interface to:
  output the time stamp data, the first trace data, and the second trace data to the debugger via an emulator; and
causing the debugger to:
  receive the time stamp data, the first trace data, and the second trace data via the emulator;
  calculate a series of second time stamp values, which corresponds to the first standard time, based on the first time stamp value included in the time stamp data and the difference value included in the second trace data; and
  associate the calculated second time stamp value with the execution result obtained by the second chip executing the software.

16. The debug method according to claim 15, comprising:
causing the first chip to output the marker to the second chip when outputting the time stamp data and the first trace data.

17. The debug method according to claim 15, comprising:
causing the first chip to:
  monitor the difference counter holding the difference value of the second chip; and
  output the marker to the second chip before exceeding capacity of the difference counter; and
causing the second chip to:
  reset the difference counter when receiving the marker.

18. The debug method according to claim 15, comprising:
causing the debugger to hold the first time stamp value included in the time stamp data as a reference time.

19. The debug method according to claim 18, comprising:
causing the debugger to update the reference time to the first time stamp value included in the next time stamp data when the next time stamp data is outputted from the first chip.

20. The debug method according to claim 18, comprising:
causing the debugger to:
  hold a first frequency of an operating clock of the first chip and a second frequency of an operating clock of the second chip;
  convert the difference value included in the second trace data into a time interval of the first standard time based on the first frequency and the second frequency;
  calculate a series of second time stamp values, which corresponds to the first standard time, based on the time interval and the reference time; and associate the second time stamp value with an execution result obtained by the second chip executing the software.

\* \* \* \* \*